(12) United States Patent
Cho et al.

(10) Patent No.: US 9,736,939 B2
(45) Date of Patent: Aug. 15, 2017

(54) PRINTED CIRCUIT BOARD AND METHOD OF MANUFACTURING PRINTED CIRCUIT BOARD

(71) Applicant: Samsung Electro-Mechanics Co., Ltd., Suwon-si (KR)

(72) Inventors: Suk Hyeon Cho, Suwon-si (KR); Yong Ho Baek, Suwon-si (KR); Young Gwan Ko, Suwon-si (KR); Yoong Oh, Suwon-si (KR); Young Kuk Ko, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/848,907

(22) Filed: Sep. 9, 2015

(65) Prior Publication Data

US 2016/0088742 A1    Mar. 24, 2016

(30) Foreign Application Priority Data

Sep. 19, 2014  (KR) .................... 10-2014-0125320
Mar. 6, 2015   (KR) .................... 10-2015-0031516

(51) Int. Cl.

| H05K 3/46 | (2006.01) |
| H05K 1/11 | (2006.01) |
| H05K 1/02 | (2006.01) |
| H05K 3/00 | (2006.01) |
| H05K 3/42 | (2006.01) |

(52) U.S. Cl.
CPC .......... *H05K 1/115* (2013.01); *H05K 1/0271* (2013.01); *H05K 3/007* (2013.01); *H05K 3/422* (2013.01); *H05K 3/4605* (2013.01); *H05K 3/4608* (2013.01); *H05K 3/4682* (2013.01); *H05K 2201/09827* (2013.01)

(58) Field of Classification Search
CPC ...... H05K 3/007; H05K 3/4682; H05K 1/112; H05K 1/113; H05K 1/114; H05K 1/115; H05K 1/116
See application file for complete search history.

(56) References Cited

U.S. PATENT DOCUMENTS

| 2009/0288293 A1* | 11/2009 | Lee .................. H05K 3/445 29/874 |
| 2012/0205039 A1 | 8/2012 | Yamada et al. |
| 2013/0062108 A1 | 3/2013 | Kondo |
| 2015/0373833 A1* | 12/2015 | Baek .................. H05K 3/4682 174/250 |

FOREIGN PATENT DOCUMENTS

| JP | 2012-186442 A | 9/2012 |
| JP | 2013-62314 A | 4/2013 |
| KR | 10-2011-0054345 A | 5/2011 |

* cited by examiner

*Primary Examiner* — Jeremy C Norris
(74) *Attorney, Agent, or Firm* — NSIP Law (57) ABSTRACT

A printed circuit board may include: a first circuit layer; a first insulating layer disposed on the first circuit layer; a high-rigidity layer disposed on the first insulating layer; and a second circuit layer disposed on the high-rigidity layer and connected to the first circuit layer by a first via extending through the first insulating layer and the high-rigidity layer, wherein a rigidity of the high-rigidity layer is greater than a rigidity of the first insulating layer.

19 Claims, 10 Drawing Sheets

PRINTED CIRCUIT BOARD AND METHOD OF MANUFACTURING PRINTED CIRCUIT BOARD

CROSS-REFERENCE TO RELATED APPLICATION(S)

This application claims the benefit under 35 USC 119(a) of Korean Patent Application No. 10-2014-0125320 filed on Sep. 19, 2014, in the Korean Intellectual Property Office, and Korean Patent Application No. 10-2015-0031516 filed on Mar. 6, 2015, in the Korean Intellectual Property Office, the entire disclosures of which are incorporated herein by reference for all purposes.

BACKGROUND

1. Field

The following description relates to a printed circuit board and a method of manufacturing the same.

2. Description of Related Art

In accordance with gradual performance improvement, miniaturization, and slimness of electronic products, a high density integrated circuit pattern of a printed circuit board has been demanded. In order to satisfy this demand, a coreless board from which a core board (support board) thicker than an interlayer insulating layer and having high strength is removed is desirable.

The coreless board may be manufactured by preparing a carrier board/core board, building up a required number of circuit layers and insulating layers on the carrier board, and, finally, removing the carrier board.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

According to one general aspect, a printed circuit board may include: a first circuit layer; a first insulating layer disposed on the first circuit layer; a high-rigidity layer disposed on the first insulating layer; and a second circuit layer disposed on the high-rigidity layer and connected to the first circuit layer by a first via extending through the first insulating layer and the high-rigidity layer, wherein a rigidity of the high-rigidity layer is greater than a rigidity of the first insulating layer.

The high-rigidity layer may be constructed of glass or metal.

The printed circuit board may further include: a second insulating layer disposed on the second circuit layer; and a third circuit layer disposed on the second insulating layer and connected to the second circuit layer by a second via extending through the second insulating layer.

The first insulating layer may enclose the first circuit layer while allowing one surface of a circuit pattern of the first circuit layer to be exposed.

The first circuit layer may protrude from a surface of the first insulating layer.

The first via may have a diameter that is decreased from one surface of the printed circuit board toward another surface of the printed circuit board.

The printed circuit board may further include an insulating member covering side surfaces of the high rigidity layer and an upper surface of the high-rigidity layer.

The printed circuit board may further include an internal wiring layer disposed on the upper surface of the high-rigidity layer.

The first via may have an hourglass shape and a diameter of the first via may decrease toward a central portion of the first via.

The printed circuit board may further include an insulating member disposed between the first via and the high-rigidity layer.

The first insulating layer may include a resin insulating layer.

According to another general aspect, a printed circuit board may include: insulating layers and circuit layers arranged in a stack such that each of the circuit layers is disposed on an upper or lower surface of a corresponding insulating layer among the insulating layers; and vias, each of the vias being disposed in at least one of the insulating layers and connecting at least two of the circuit layers to each other, wherein each of the vias has a diameter that decreases from one surface of the printed circuit board toward another surface of the printed circuit board, and one or more of the insulating layers includes a resin insulating layer and a high-rigidity layer having a rigidity greater than a rigidity of the resin insulating layer.

The high-rigidity layer may be constructed of glass or metal.

The printed circuit board may include an insulating member covering side surfaces of the high-rigidity layer and an upper surface of the high-rigidity layer.

The printed circuit board may include an insulating member disposed between a via, among the vias, and the high-rigidity layer.

According to yet another general aspect, a method of manufacturing a printed circuit board may include: forming first circuit layers on outer metal plates that are attached to a core of a carrier board; forming first insulating layers covering the first circuit layers; forming high-rigidity layers on the first insulating layers, the high-rigidity layers having a rigidity that is greater than a rigidity of the first insulating layers; forming insulating members on the high-rigidity layers; forming first vias, each of the first vias extending in one of the high-rigidity layers and a corresponding one of the first insulating layers; forming second circuit layers on the insulating members; and separating the outer metal plates from the core.

The insulating members may contact the first vias.

The method may include: forming second insulating layers covering the second circuit layers; forming second vias in the second insulating layers; and forming third circuit layers on the second insulating layers.

The separating of the outer metal plates from the core may form two printed circuit boards having a substantially same construction.

Other features and aspects will be apparent from the following detailed description, the drawings, and the claims.

BRIEF DESCRIPTION OF DRAWINGS

FIGS. 2 through 6 are cross-sectional views illustrating other example structures of printed circuit boards.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Printed Circuit Board

Figure 1:
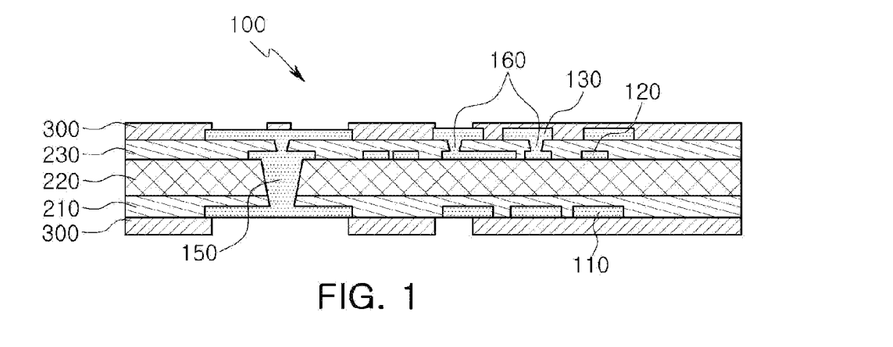
FIG. 1 is a cross-sectional view illustrating an example structure of a printed circuit board.

FIG. 1 is a cross-sectional view illustrating an example structure of a printed circuit board 100.

Referring to FIG. 1, the printed circuit board 100 includes a first circuit layer 110, a first insulating layer 210 disposed on the first circuit layer 110, a high-rigidity layer 220 disposed on the first insulating layer 210, and a second circuit layer 120 disposed on the high-rigidity layer 220 and connected to the first circuit layer 110 by a first via 150 extending through the first insulating layer 210 and the high-rigidity layer 220.

The printed circuit board 100 may have a construction of a coreless board that does not include a core board, unlike a common construction in which build-up layers are continuously formed on two surfaces or one surface of a core board, which is a support substrate.

Since a core board is not present in a coreless board, it may be difficult to provide sufficient rigidity of the coreless board, and deformation such as warpage, twisting, or the like, may be generated in the coreless board during manufacturing of the coreless board.

Therefore, in the example of FIG. 1, at least one high-rigidity layer 220 may be formed in the coreless board 100 to improve mechanical strength of the coreless board, thereby resisting deformation such as warpage, twisting, or the like, of the coreless board.

The first and second circuit layers 110 and 120 may be constructed of a conductive metal for a circuit pattern, such as copper (Cu).

According to an example, a circuit pattern of the first circuit layer 110 may be embedded in the first insulating layer 210. The first insulating layer 210 may enclose the first circuit layer 110 while allowing a first surface (e.g., the bottom surface) of the circuit pattern of the first circuit layer 110 to be exposed. More specifically, the circuit pattern of the first circuit layer 110 may be embedded in the first insulating layer 210 so that the first surface thereof is exposed at a first surface (e.g., the bottom surface) of the first insulating layer 210. The first circuit layer 110 may be embedded in the first insulating layer 210 to further densify interfacial connections between circuit patterns and implement a finer circuit.

The first insulating layer 210 may be, for example, a resin insulating layer and may be constructed of a thermosetting resin such as an epoxy resin, or a thermoplastic resin such as polyimide. Alternatively, a resin in which reinforcement material such as glass fiber or an inorganic filler is impregnated, such as a pre-preg, may be used. However, the material of the resin insulating layer is not particularly limited to the preceding examples. The high-rigidity layer 220 may be formed of a material having rigidity greater than that of the first insulating layer 210.

The high-rigidity layer 220 may be formed, for example, of glass or metal. The metal may be, for example, a high-rigidity alloy containing iron (Fe). The high-rigidity layer 220 may be included in the printed circuit board to improve mechanical strength of the coreless board 100, thereby suppressing deformation such as warpage, twisting, or the like, of the coreless board 100.

The second circuit layer 120 may be disposed on the high-rigidity layer 220, and the first and second circuit layers 110 and 120 may be connected to each other by the first via 150.

The first via 150 may extend through the first insulating layer 210 and the high-rigidity layer 220 to connect the first and second circuit layers 110 and 120 to each other.

The first via 150 may be formed of the same material as that of the first and second circuit layers 110 and 120, such as copper (Cu). However, the material of the first via 150 is not necessarily limited to copper or the same material as that of the first and second circuit layers 110 and 120, and may be any conductive material.

A second insulating layer 230 may be formed on the second circuit layer 120, and a third circuit layer 130 may be formed on the second insulating layer 230. The second and third circuit layers 120 and 130 may be connected to each other by second vias 160 extending through the second insulating layer 230.

According to an example, all of the vias 150 and 160 formed in the printed circuit board 100 may have a diameter that is decreased from one surface (e.g., the top surface) of the printed circuit board 100 toward the other surface (e.g., the bottom surface) of the printed circuit board 100. For example, as illustrated in FIG. 1, all of the first and second vias 150 and 160 may have a tapered shape and diameters of the first and second vias 150 and 160 may be decreased from the top of the via toward the bottom of the via. However, the first and second vias 150 and 160 are not necessarily limited to having the above-mentioned shape, and diameters of the first and second vias 150 and 160 may be increased from the top of the via toward the bottom of the via.

Although FIG. 1 illustrates an example including three circuit layers (the first through third circuit layers 110 to 130), the number of circuit layers is not necessarily limited thereto, and may be three or more in a range that may be utilized by those skilled in the art.

In addition, although FIG. 1 illustrates the high-rigidity layer 220 disposed between the first circuit layer 110, which is the lowest circuit layer, and the second circuit layer 120, the high-rigidity layer 220 is not limited to being disposed between the first and second circuit layers 110 and 120, and may be formed on at least one of the insulating layers 210 and 230 disposed between the circuit layers 110 and 120.

A solder resist 300 exposing circuit patterns for external connection pads may be disposed on the top and/or bottom surface of the printed circuit board 100.

FIGS. 2 through 6 are cross-sectional views illustrating structures of printed circuit boards according to other examples.

Figure 2:
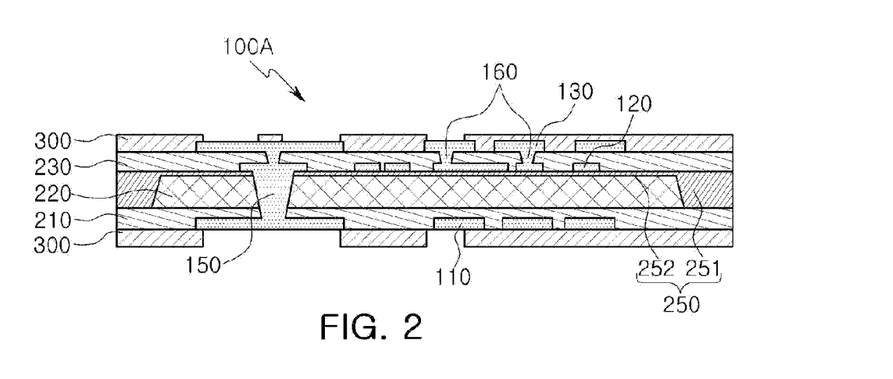

Referring to FIG. 2, in a printed circuit board 100A according to another example, an insulating member 250 covering the high-rigidity layer 220 may be disposed between the first and second circuit layers 110 and 120. A thermosetting resin such as an epoxy resin, or a thermoplastic resin such as polyimide may be used for the insulating member 250. In addition, the insulating member 250 may further contain an inorganic filler. The insulating member 250 may include insulating portions 251 and 252 covering side surfaces and an upper surface, respectively, of the high-rigidity layer 220.

In a case in which the high-rigidity layer 220 is formed of glass, for example, generation of cracks in the high rigidity layer 220 when the printed circuit board 100A is cut into individual printed circuit boards may be prevented by the insulating portion 251 covering the side surfaces of the high-rigidity layer 220.

In a case in which a circuit layer is formed on the high-rigidity layer 220, close adhesion between the high-rigidity layer 220 and the circuit layer may decrease over time or due to deformation of the printed circuit board. However, in the example of FIG. 2, the insulating portion 252 covering the upper surface of the high-rigidity layer 220 may be provided, and the second circuit layer 120 may be formed on an upper surface of the insulating member 252 to avoid the problem of a decrease in close adhesion between the high-rigidity layer 220 and the second circuit layer 120, thereby preventing the second circuit layer 120 from becoming loose.

The components of the printed circuit board 100A may be the same as those of the printed circuit board 100 according to the embodiment of FIG. 1, except for the insulating member 250.

Figure 3:
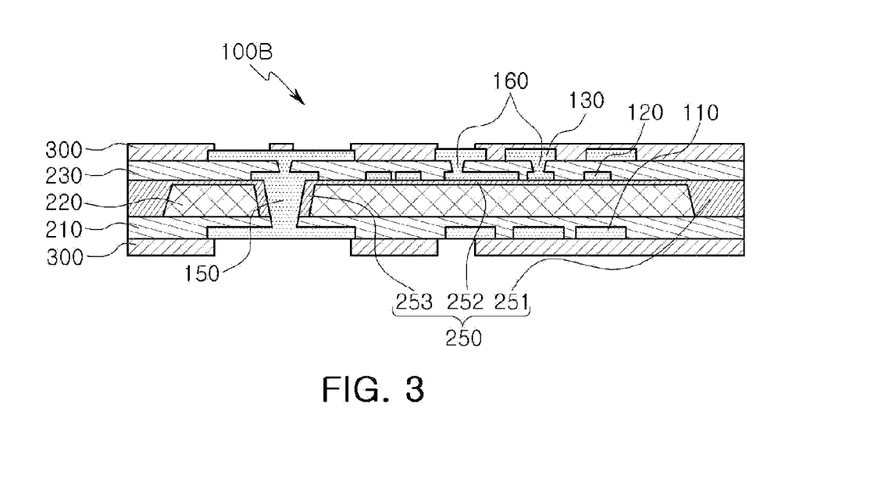

Referring to FIG. 3, in a printed circuit board 100B according to another example, the insulating member 250 may be further formed between the high-rigidity layer 220 and the first via 150.

In a case in which a via is directly formed in the high-rigidity layer 220, close adhesion between the high-rigidity layer 220 and the via may decrease over time, or due to deformation of the printed circuit board. In order to avoid the problem of such a decrease in close adhesion between the high-rigidity layer 220 and the first via 150, in the example of FIG. 3, the insulating member 250 includes an insulating portion 253 formed between the high-rigidity layer 220 and the first via 150, thereby preventing the first via 150 from becoming loose. In addition, in a case in which the high-rigidity layer 220 is formed of glass, for example, the insulating portion 253 may prevent the generation of cracks in the high-rigidity layer 220 during formation of a via hole using a laser, or the like.

The components of the printed circuit board 100B may be the same as those of the printed circuit board 100A in the embodiment of FIG. 2, except that the insulating portion 253 is formed between the high-rigidity layer 220 and the first via 150.

Figure 4A:
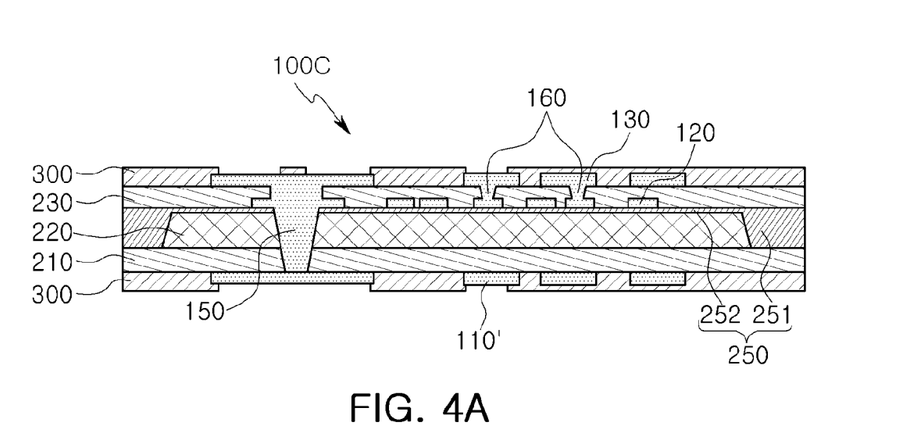
Figure 4B:
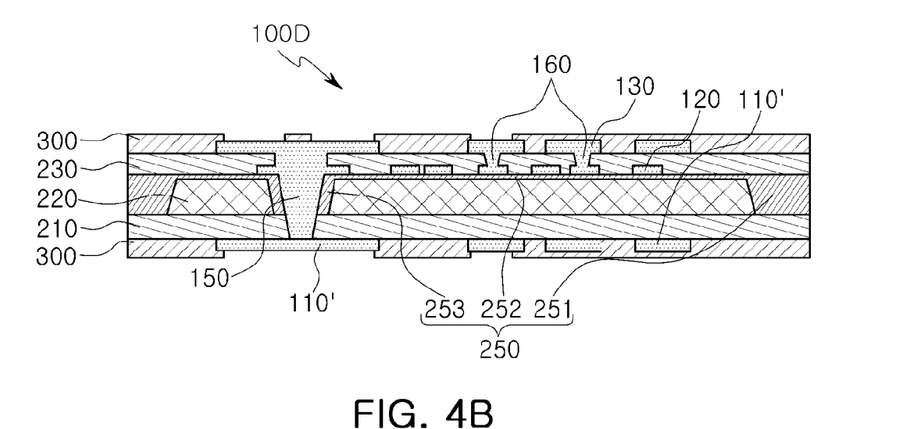

Referring to FIGS. 4A and 4B, in printed circuit boards 100C and 100D according to other examples, circuit patterns of a first circuit layer 110' may be disposed on and protrude from the first surface of the first insulating layer 210. Therefore, the outermost circuit layers of the printed circuit board, for example, the first and third circuit layers 110' and 130, respectively, may have a structure in which they protrude in opposite directions.

In FIG. 4A, the circuit patterns of the first circuit layer 110' may protrude from the first surface of the first insulating layer 210, and the insulating portions 251 and 252 may cover the side surfaces and the upper surface, respectively, of the high-rigidity layer 220. In FIG. 4B, the circuit patterns of the first circuit layer 110' may protrude from the first surface of the first insulating layer 210, the insulating portions 251 and 252 may cover the side surfaces and the upper surface, respectively, of the high-rigidity layer 220, and the insulating portion 253 may be formed between the high-rigidity layer 220 and the first via 150.

The components of the printed circuit boards 100C and 100D may be the same as those of the printed circuit board 100A and 100B, respectively, except for the first circuit layer 110' having the protruding circuit patterns.

Figure 5:
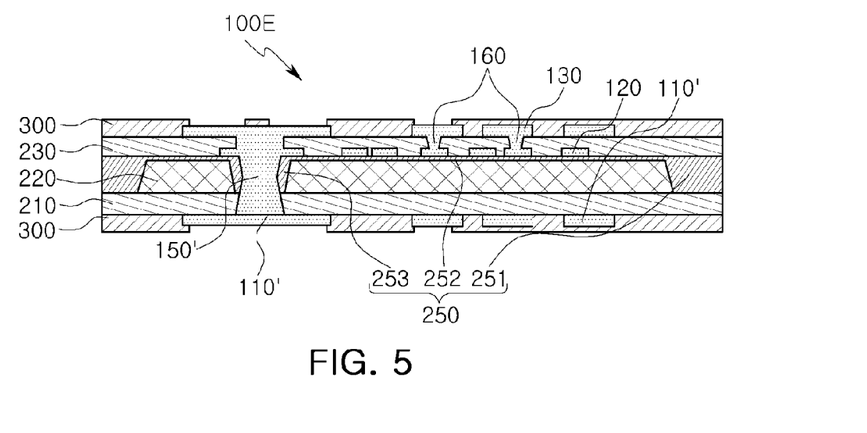

Referring to FIG. 5, in another example printed circuit board 100E, a first via 150' may have an hourglass shape and a diameter of the first via 150' may be decreased from the first and second circuit layers 110' and 120 toward a central portion of the first via 150'. The first circuit layer 110' may be disposed on and protrude from the first surface of the first insulating layer 210.

The components of the printed circuit board 100D may be the same as those of the printed circuit board 100C, except for the first via 150' having the hourglass shape.

Figure 6:
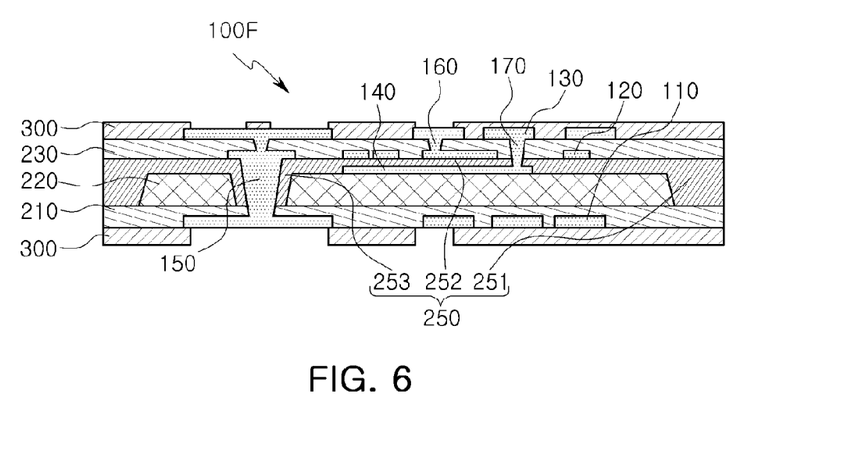

Referring to FIG. 6, in another example printed circuit board 100F, an internal wiring layer 140 may be disposed on the upper surface of the high-rigidity layer 220. The internal wiring layer 140 may be formed of circuit patterns, inductors, capacitors, resistors, and the like. The internal wiring layer 140 may be connected to the third circuit layer 130 disposed on the second insulating layer 230 by a third via 170.

The components of the printed circuit board 100E may be the same as those of the printed circuit board 100B (FIG. 3), except for the internal wiring layer 140 and the third via 170.

Method of Manufacturing Printed Circuit Board

Figure 7A:
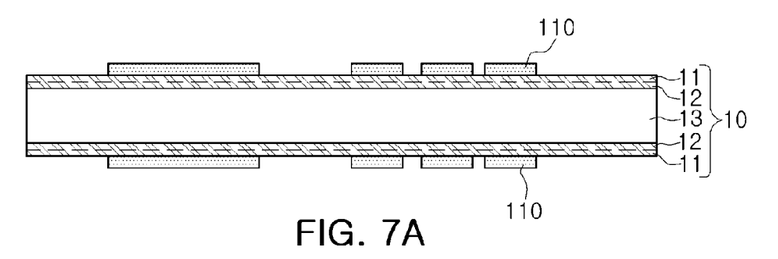
FIGS. 7A through 7L are views illustrating an example method of manufacturing a printed circuit board.
Figure 7B:
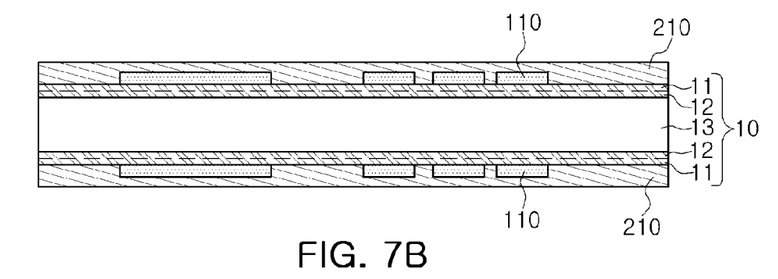
Figure 7C:
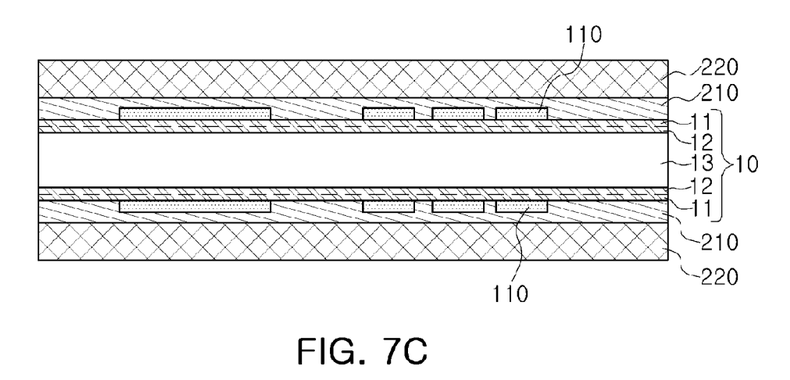
Figure 7D:
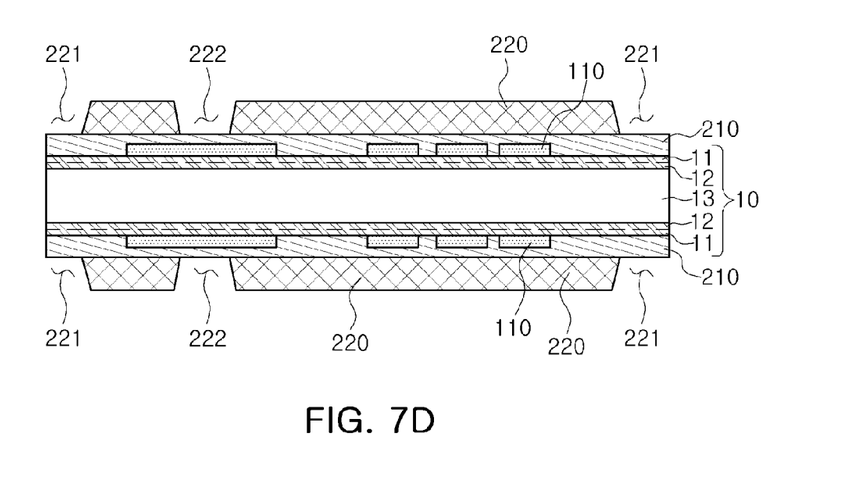
Figure 7E:
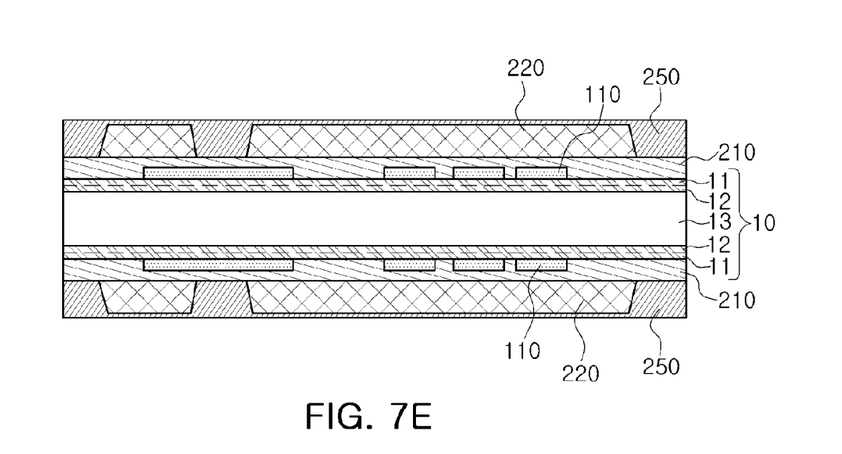
Figure 7F:
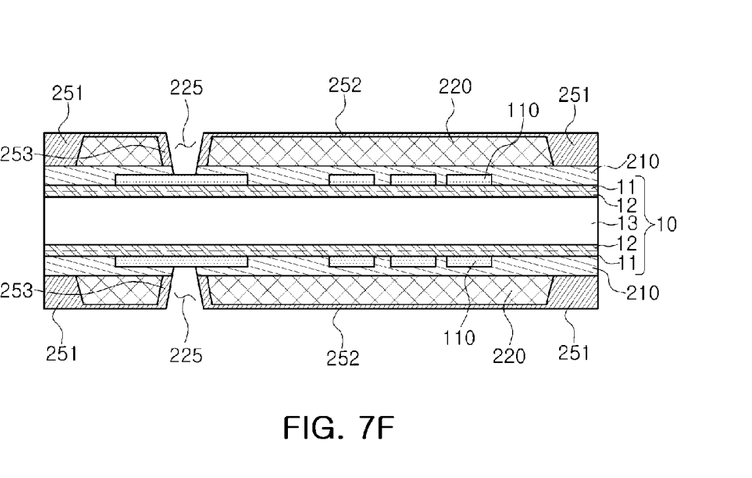
Figure 7G:
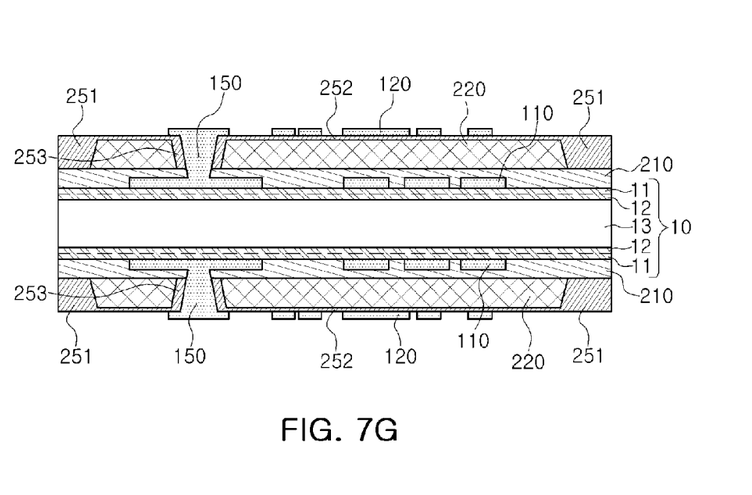
Figure 7H:
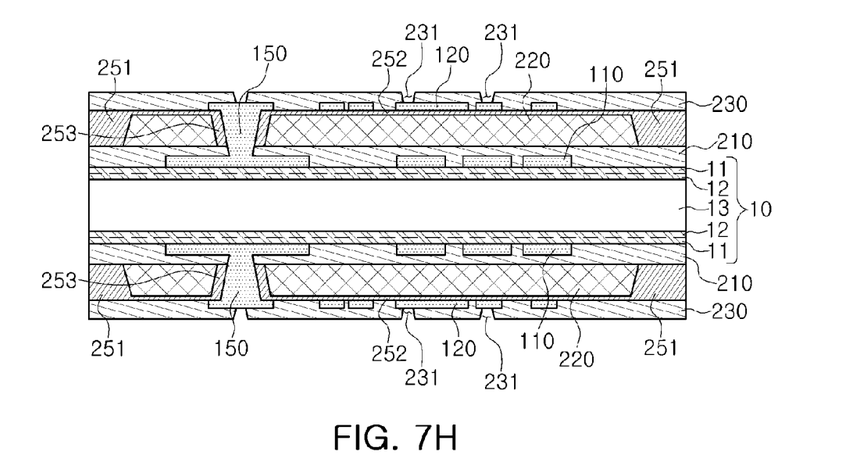
Figure 7I:
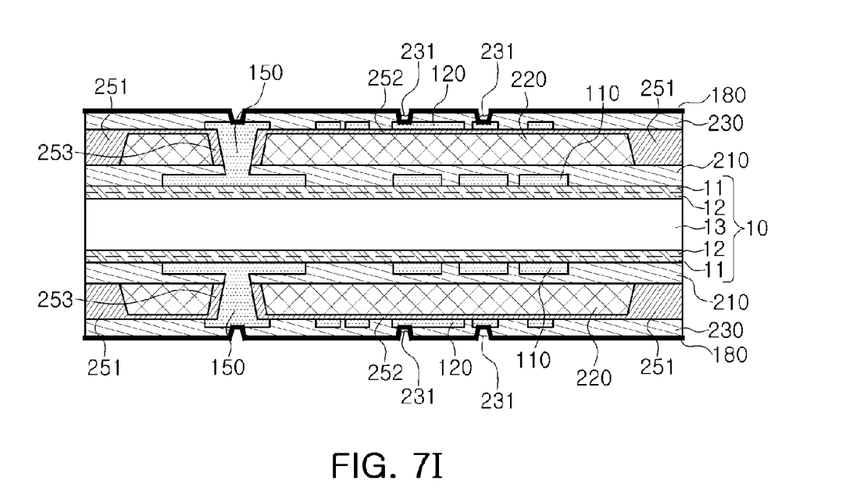
Figure 7J:
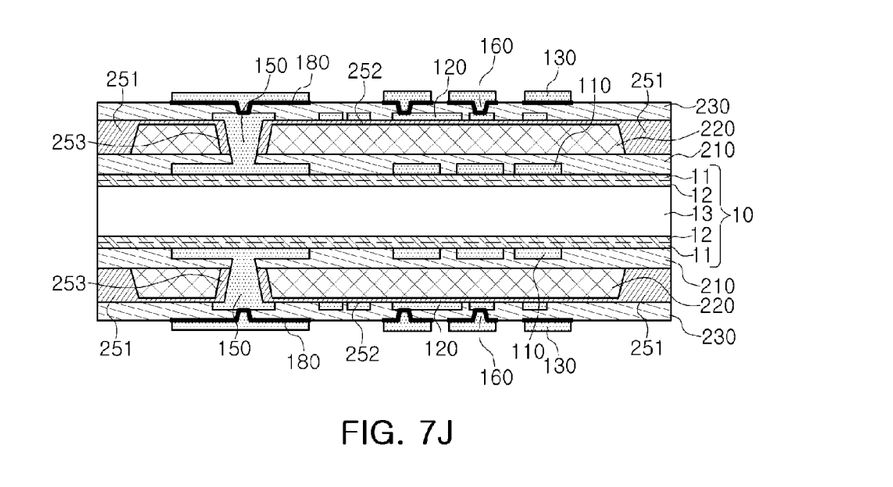
Figure 7K:
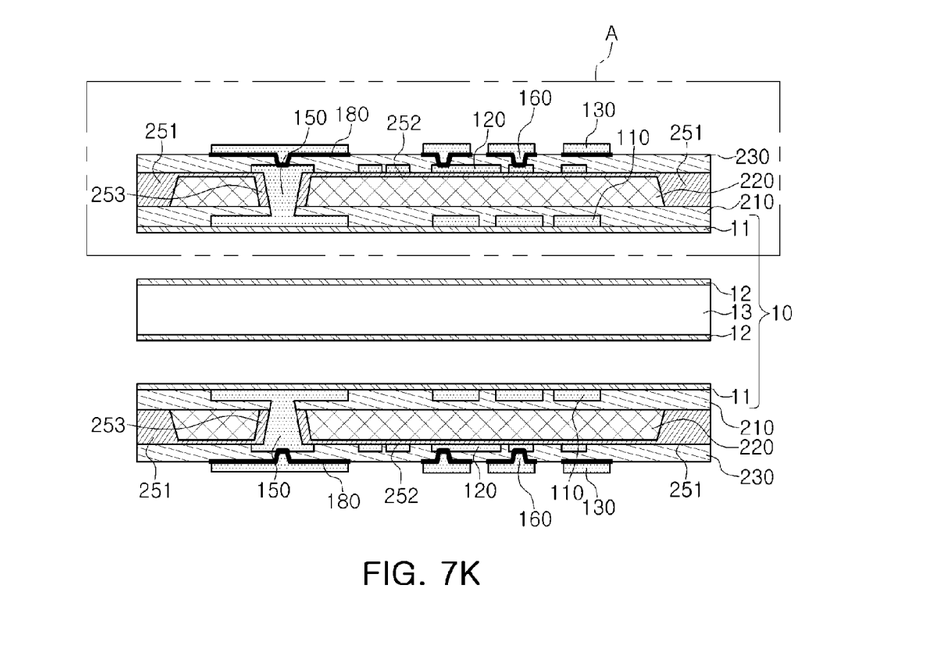
Figure 7L:
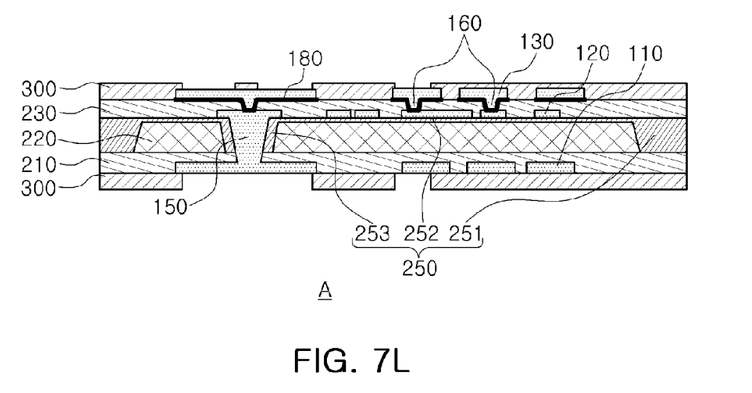

FIGS. 7A through 7L are views illustrating an example method of manufacturing a printed circuit board A (FIG. 7L).

Referring to FIG. 7A, a carrier board 10 may be prepared, and first circuit layers 110 may be formed on top and bottom surfaces of the carrier board 10. The carrier board 10 may include a core part 13, inner metal plates 12 disposed on top and bottom surfaces of the core part 13, and outer metal plates 11 disposed on the inner metal plates 12. Each of the inner and outer metal plates 12 and 11 may be constructed of a copper (Cu) foil, or another suitable material. At least one bonded surface of the inner metal plates 12 and the outer metal plates 11 may be surface-treated so that the inner metal plates 12 and the outer metal plates 11 are easily separated from each other.

The first circuit layers 110 may be formed by forming a plating resist having openings for forming the first circuit layer on the outer metal plates 11 and filling the openings with a conductive metal.

The openings may be filled with the conductive metal by an electroplating method, or the like, and the conductive metal may be any metal having excellent electrical conductivity, such as copper (Cu).

Referring to FIG. 7B, first insulating layers 210 covering the first circuit layers 110 may be formed on the outer metal plates 11 on which the first circuit layers 110 are formed. A resin insulating layer may be used for the first insulating layers 210. The resin insulating layer may include a thermosetting resin such as an epoxy resin, or a thermoplastic resin such as polyimide. Alternatively, a resin in which reinforcement material such as glass fiber or an inorganic filler is impregnated, such as a pre-preg, may be used. However, the material of the resin insulating layer is not particularly limited to the preceding examples.

Referring to FIG. 7C, high-rigidity layers 220 may be formed on the first insulating layers 210. The high-rigidity layers 220 may be constructed of a material having rigidity greater than that of the first insulating layers 210. The high-rigidity layers 220 may be constructed of glass or a metal. The metal may be, for example, a high-rigidity alloy containing iron (Fe).

Referring to FIG. 7D, side surface openings 221 and openings 222 for forming vias may be formed in the high-rigidity layers 220. The side surface openings 221 may be continuously formed along a boundary between unit regions for forming individual printed circuit boards. The unit regions for forming individual printed circuit boards may be set in the high-rigidity layers 220, and the boundary used at the time of being cut into individual printed circuit boards may be set between the regions for forming individual printed circuit boards.

The side surface openings 221 may be formed in a trench shape along four side surfaces of the high-rigidity layers 220, and the openings 222 for forming a via may be formed in a tapered shape. The side surface openings 221 and the openings 222 for forming vias may be formed by first forming through-holes using a mechanical drill, a laser drill, or the like, and then widening the through-holes through chemical etching. However, processes for forming the side surface openings 221 and the openings 222 are not necessarily limited to the preceding examples.

Referring to FIG. 7E, insulating members 250 covering the high-rigidity layers 220 may be formed. The insulating members 250 may be constructed of a thermosetting resin such as an epoxy resin, or a thermoplastic resin such as polyimide. In addition, the insulating members 250 may further contain an inorganic filler.

The side surface openings 221 and the openings 222 for forming vias may be filled with the respective insulating members 250, and upper surfaces of the high-rigidity layers 220 may be coated with the respective insulating members 250.

Referring to FIG. 7F, first via holes 225 may be formed in the first insulating layers 210 and the portions 253 of the insulating members 250 formed in the openings 222 for forming vias. The first via holes 225 may have a tapered shape of which a diameter may be decreased toward a portion adjacent to the carrier board 10. The first via holes 225 may be formed using a mechanical drill or a laser drill. The laser drill may be a $CO_2$ laser or a YAG laser, but is not particularly limited thereto. Other methods of forming the first via holes 225 are also possible.

Referring to FIG. 7G, the first via holes 225 may be filled with a conductive metal to form first vias 150, and second circuit layers 120 may be formed on the portions 252 of the insulating members 250 formed on upper surfaces of the high-rigidity layers 220.

The first vias 150 and the second circuit layers 120 may be formed by forming electroless plating seed layers (not illustrated) on the insulating members 250, forming a plating resist having openings for forming the second circuit layers 120, and filling the openings with a conductive metal by electroplating, or the like.

Referring to FIG. 7H, respective second insulating layers 230 may be formed on the second circuit layers 120, and second via holes 231 may be formed in the second insulating layers 230. The second via holes 231 may have a tapered shape of which a diameter may decrease toward a portion adjacent to the carrier board 10.

Referring to FIG. 7I, electroless plating layers 180 may be formed on the second insulating layers 230.

Referring to FIG. 7J, the second via holes 231 may be filled with a conductive metal to form the second vias 160, and respective third circuit layers 130 may be formed on the second insulating layers 230. The third circuit layers 130 may be formed by forming a plating resist having openings for forming a third circuit layer and then filling the openings with a conductive metal by electroplating or the like.

Three or more circuit layers may be formed in a range that may be utilized by those skilled in the art by repeating the operations of forming the vias and the circuit layers described above.

Referring to FIG. 7K, the inner metal plates 12 and the outer metal plates 11 may be separated from each other to form two printed circuit boards A having substantially the same construction and configuration. The inner metal plates 12 and the outer metal plates 11 may be separated from each other using a blade. However, the inner metal plates 12 and the outer metal plates 11 are not limited to the preceding examples, and may be separated from each other by all methods known in the related art. In a separated printed circuit board A, the first circuit layer 110 may be embedded in the first insulating layer 210. Referring to FIG. 7L, the outer metal plate 11 formed on one surface of the printed circuit board A may be etched and removed, and a solder resist 300 may be formed on the surface of the printed circuit board A so that circuit patterns for external connection pads of circuit patterns on the outermost circuit layer are exposed.

Figure 8A:
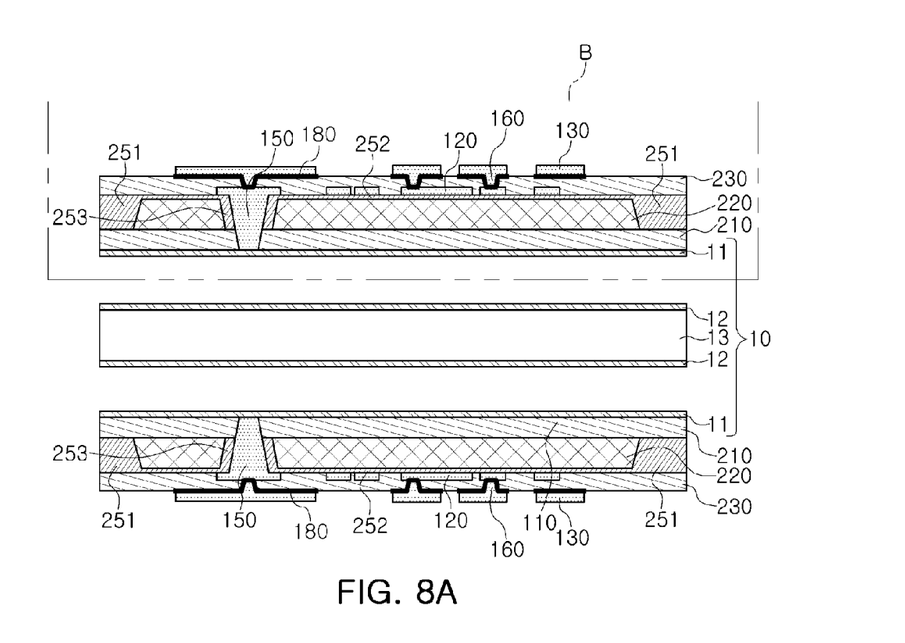
FIGS. 8A through 8C are views illustrating another example method of manufacturing a printed circuit board.
Figure 8B:
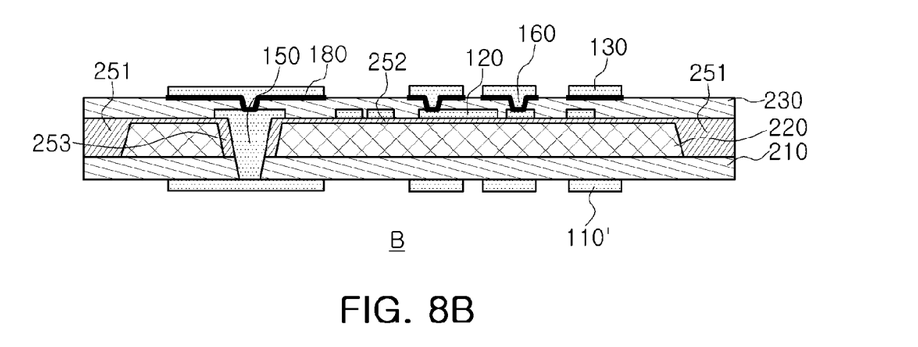
Figure 8C:
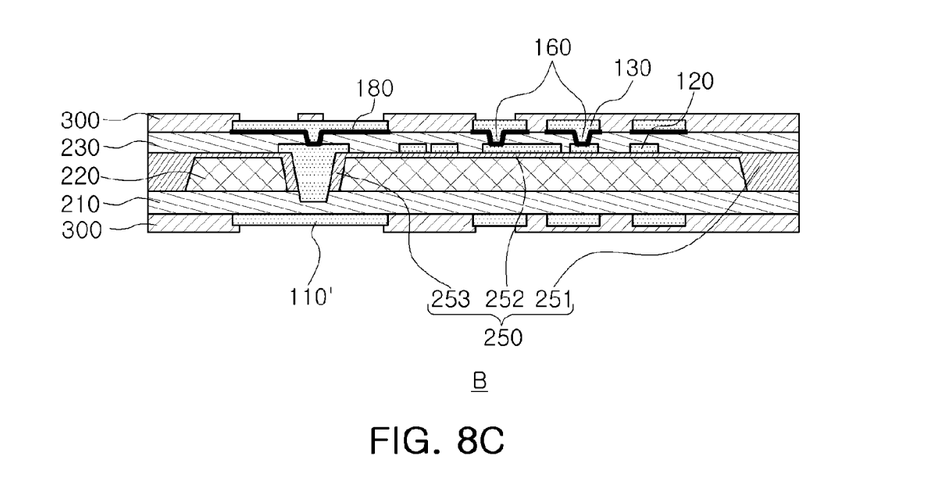

FIGS. 8A through 8C are views sequentially illustrating a method of manufacturing a printed circuit board B (FIG. 8C), according to another example.

Referring to FIG. 8A, the first insulating layers 210 may be directly formed on the top and bottom surfaces of the carrier board 10 without forming the first circuit layers 110 on the carrier board 10.

The manufacturing process of FIGS. 8A-8C may be the same as the manufacturing process of FIGS. 7A-7L, except that the first circuit layer 110 is not formed.

Referring to FIG. 8B, a first circuit layer 110' may be formed on an outer metal plate 11 of a separated printed circuit board B, and regions in which the first circuit layer 110' is not formed in the outer metal plate 11 may be etched and removed.

Therefore, the first circuit layer 110' may be formed such that it protrudes from a first surface of the first insulating layer 210. That is, the outermost circuit layers of the printed circuit board, for example, the first and third circuit layers 110' and 130, may have a structure in which they protrude in opposite directions.

Referring to FIG. 8C, a solder resist 300 may be formed on the top and bottom surfaces of the printed circuit board B so that circuit patterns for external connection pads of circuit patterns of the outermost circuit layer are exposed.

As set forth in the examples above, a coreless printed circuit board with improved resistance to deformation such as warpage, twisting, or the like, is provided.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A printed circuit board comprising:
a first circuit layer;
a first insulating layer disposed on the first circuit layer;
a high-rigidity layer disposed on the first insulating layer;
a second circuit layer disposed on the high-rigidity layer;
a first via hole penetrating the first insulating layer and the high-rigidity layer;
a first via formed in the first via hole and connecting the first circuit layer to the second circuit layer; and
an electroless plating seed layer formed between an inner wall of the first via hole and the first via,
wherein a rigidity of the high-rigidity layer is greater than a rigidity of the first insulating layer.

2. The printed circuit board of claim 1, wherein the high-rigidity layer is constructed of glass or metal.

3. The printed circuit board of claim 1, further comprising:
a second insulating layer disposed on the second circuit layer; and
a third circuit layer disposed on the second insulating layer and connected to the second circuit layer by a second via extending through the second insulating layer.

4. The printed circuit board of claim 1, wherein the first insulating layer encloses the first circuit layer while allowing one surface of a circuit pattern of the first circuit layer to be exposed.

5. The printed circuit board of claim 1, wherein the first circuit layer protrudes from a surface of the first insulating layer.

6. The printed circuit board of claim 1, wherein the first via has a diameter that is decreased from one surface of the printed circuit board toward another surface of the printed circuit board.

7. The printed circuit board of claim 1, further comprising an insulating member covering side surfaces of the high rigidity layer and an upper surface of the high-rigidity layer.

8. The printed circuit board of claim 7, further comprising an internal wiring layer disposed on the upper surface of the high-rigidity layer.

9. The printed circuit board of claim 1, wherein the first via has an hourglass shape and a diameter of the first via decreases toward a central portion of the first via.

10. The printed circuit board of claim 1, further comprising an insulating member disposed between the first via and the high-rigidity layer.

11. The printed circuit board of claim 1, wherein the first insulating layer comprises a resin insulating layer.

12. A printed circuit board comprising:
insulating layers and circuit layers arranged in a stack such that each of the circuit layers is disposed on an upper or lower surface of a corresponding insulating layer among the insulating layers; and
vias, each of the vias being disposed in at least one of the insulating layers and connecting at least two of the circuit layers to each other,
wherein every one of the vias has a diameter that decreases in a same direction from one surface of the printed circuit board toward another surface of the printed circuit board,
wherein one or more of the insulating layers includes a resin insulating layer and a high-rigidity layer having a rigidity greater than a rigidity of the resin insulating layer.

13. The printed circuit board of claim 12, wherein the high-rigidity layer is constructed of glass or metal.

14. The printed circuit board of claim 12, further comprising an insulating member covering side surfaces of the high-rigidity layer and an upper surface of the high-rigidity layer.

15. The printed circuit board of claim 12, further comprising an insulating member disposed between a via, among the vias, and the high-rigidity layer.

16. A method of manufacturing a printed circuit board, comprising:
forming a first circuit layer on a surface of an outer metal plate attached to one surface of a core of a carrier board;
forming a first insulating layer covering the first circuit layer;
forming a high-rigidity layer on the first insulating layer, the high-rigidity layer having a rigidity that is greater than a rigidity of the first insulating layer;
forming an insulating member on the high-rigidity layer;
forming a first via integrally penetrating the first insulating layer, the high-rigidity layer and the insulating member;
forming a second circuit layer on the insulating member; and
separating the outer metal plate from the core.

17. The method of claim 16, wherein the insulating member makes contact with the first via.

18. The method of claim 16, comprising;
forming a second insulating layer covering the second circuit layer;
forming a second via in the second insulating layer; and
forming a third circuit layer on the second insulating layer.

19. The method of claim 16, wherein the first circuit layer is formed on a surface of an outer metal plate attached to another surface of the core of the carrier board.

* * * * *